United States Patent [19]
Ludwig

[11] Patent Number: 5,575,081
[45] Date of Patent: Nov. 19, 1996

[54] DEVICE FOR TRANSPORTING MAGAZINES FOR MOLDING WAFER-SHAPED OBJECTS

[75] Inventor: Joachim Ludwig, Jena, Germany

[73] Assignee: Jenoptik GmbH, Jena, Germany

[21] Appl. No.: 411,721

[22] PCT Filed: Jul. 25, 1994

[86] PCT No.: PCT/EP94/02446

§ 371 Date: Apr. 3, 1995

§ 102(e) Date: Apr. 3, 1995

[87] PCT Pub. No.: WO95/05002

PCT Pub. Date: Feb. 16, 1995

[30] Foreign Application Priority Data

Aug. 5, 1993 [DE] Germany .......................... 43 26 308.9

[51] Int. Cl.⁶ ...................................................... F26B 19/00
[52] U.S. Cl. ................................ 34/218; 34/222; 34/224; 414/217
[58] Field of Search ...................... 34/218, 72, 83, 34/84, 108, 130, 138, 139, 526, 548, 559; 414/217, 939, 940; 141/98

[56] References Cited

U.S. PATENT DOCUMENTS

| | | | |
|---|---|---|---|
| 4,724,874 | 2/1988 | Parikah et al. ............................ | 141/98 |
| 4,823,480 | 4/1989 | Komatsuzaki ............................ | 34/218 |
| 5,169,272 | 12/1992 | Bonora et al. ........................... | 414/217 |
| 5,217,053 | 6/1993 | Foster et al. ............................. | 414/217 |
| 5,308,989 | 5/1994 | Brubaker ................................. | 414/217 |
| 5,444,923 | 8/1995 | Romm et al. ............................. | 34/218 |

FOREIGN PATENT DOCUMENTS

| | | | |
|---|---|---|---|
| 0273226 | 7/1988 | European Pat. Off. . | |
| 0313693 | 5/1989 | European Pat. Off. . | |
| 2117133 | 5/1990 | Japan ..................................... | 34/218 |
| WO92/07759 | 5/1992 | WIPO . | |

Primary Examiner—John M. Sollecito
Assistant Examiner—Steve Gravini
Attorney, Agent, or Firm—McAulay Fisher Nissen Goldberg & Kiel, LLP

[57] ABSTRACT

The object of a device for transporting magazines for holding wafer-shaped objects is to ensure an exchange of gases within a SMIF box to the required extent at low cost and in an effective manner with respect to time in conformity to the working regimen associated with an SMIF system. A gas feed duct proceeding from closable ducts incorporated in the wall opens into gas distributing means. A gas discharge duct communicates with a gas outlet adjacent to the gas distribution means opposite the magazine. The device is preferably used in the fabrication of semiconductor chips.

13 Claims, 6 Drawing Sheets

DEVICE FOR TRANSPORTING MAGAZINES FOR MOLDING WAFER-SHAPED OBJECTS

BACKGROUND OF THE INVENTION a) Field of the Invention

The invention is directed to a device for transporting magazines holding wafer-shaped objects formed of a magazine container which can be deposited with its a releasable bottom and a depositing surface of its wall on a holding plate of an enclosure for a clean room, wherein the holding plate has a lowerable plate part supporting the bottom with the wafer magazine. The magazine container is a SMIF box whose use is favored in the fabrication of semiconductor chips.

b) Description of the Related Art

Systems known as SMIF (Standard Mechanical Interface) systems contain a so-called SMIF box as a magazine container with an enclosed volume in which wafer magazines can be stored and transported. The SMIF box has a releasable bottom and is set down upon a holding plate of an enclosure for a clean room in such a way that adhering dust particles are trapped between the bottom of the SMIF box and a plate part which can be lowered into the clean room. The box itself surrounds the opening made in the enclosure.

A transport device of the type mentioned above is known, for instance, from U.S. Pat. No. 5,169,272.

Because of increasingly exacting demands for quality, a number of process steps in semiconductor chip fabrication require that work be carded out within the enclosure in a gas atmosphere adapted to the production process. The quality of this gas atmosphere has a decisive influence on the production results. In order to avoid disturbing the gas atmosphere when opening the box, it is necessary to produce within the box identical atmospheric conditions or a state in which the gas atmosphere is not influenced.

With the object of ensuring such adapted conditions, U.S. Pat. No. 5,169,272 describes a process and a device which provide a stepwise lowering of the releasable bottom accompanied by generation of pressure differentials for the purpose of cleaning the SMIF box. The generated pressure differential prevents gas from entering the clean room during the lowering process or while cleaning the SMIF box by means of guiding gas in the region of the bottom from one side of the SMIF box to the other.

A disadvantage in this solution consists in that the flow of gas through the interior of the box is incomplete, so that there is no assurance that a required concentration gradient will be achieved within an acceptable time period.

On the other hand, high-temperature processes, for instance, require removal of oxygen. Since the nitrogen conventionally used for purging is heavier than the oxygen or oxygen-nitrogen mixture, an adequate change in the concentration of nitrogen to oxygen may not be possible. If the box and magazine are purged with gas in an airlock, the consumption of gas increases by a multiple and the purging time is substantially prolonged.

U.S. Pat. No. 4,724,874 provides a duct which connects the interior region of the SMIF box directly with an exterior region. A vacuum or over-pressure can be generated in the SMIF box and gas can be transported into the interior via the duct. This technical solution is not suitable for carrying out an effective exchange of gas within the SMIF box. In spite of the high cost, a relatively long period of time is needed to achieve a permissible residual concentration of harmful gas in a process gas.

Further, EP 273 226 A2 discloses a closable dust-tight transport container with standardized outer dimensions whose semiconductor wafer holder is arranged within the inner hood so as to be movable without friction. Openings in an outer base plate and inner base plate and a filter element at the inner base plate serve to ensure particle-free air flow under fluctuating pressure ratios. Means serving only to compensate for pressure are not suitable for generating within the transport container a gas atmosphere adapted to the production process.

OBJECT AND SUMMARY OF THE INVENTION

The object of the present invention is to ensure an exchange of gases within a SMIF box to the required extent at low cost and in an effective manner with respect to time in conformity to the working regimen associated with an SMIF system.

According to the invention, by means of a device for transporting magazines for holding wafer-shaped objects having a magazine container which can be deposited, with a releasable bottom and a depositing surface of its wall, on a holding plate of an enclosure for a clean room, wherein the holding plate has a lowerable plate part supporting the bottom with the wafer magazine, this object is met in that a gas feed duct proceeding from closable ducts incorporated in the wall opens into means for distributing gas, and a gas discharge duct communicates with a gas outlet adjacent to the gas distribution means opposite the magazine.

In the solution according to the invention, the gas exchange is carried out to completion to a great extent by using a purging process distributed along the entire interior region of the SMIF box, which gas exchange commences immediately after placement-of the SMIF box and is concluded in the shortest possible time.

The means for distribution of gas are advantageously formed by a delivery strip which is removably fastened to the wall and tightly connected with the gas feed duct and in which are incorporated gas distribution openings which are directed substantially to spaces between the wafer-shaped objects and adjacent to the bottom and top surfaces of the magazine. The gas outlet is formed by a discharge strip which is removably fastened to the wall, has gas discharge openings and is tightly connected with the gas discharge duct. The ducts terminate at the depositing surface in automatically closing valves which are opened when the magazine container is deposited by means of pipe pieces projecting out of the holding plate so as to face the depositing surface.

The pipe piece for opening the valve at the gas feed duct is connected to a gas source and the pipe piece for opening the valve at the gas discharge duct is connected to a vacuum. The gas exiting from the gas source and the connection to the vacuum are both regulated by a feeler which is actuated when the magazine is deposited.

Another advantage consists in that an enlarged flow-in space whose boundaries are formed by angled portions of the wall and a diffuser which is arranged downstream of the flow-in space in the direction of flow and is fastened to the releasable bottom are provided as means for gas distribution and in that the gas outlet is formed by a gas discharge duct which communicates with the interior of the magazine container via an enlarged flow-out space formed by angled portions of the wall.

The gas feed duct and the gas discharge duct can be closed by means of flow-in valves actuated by gas pressure or can be provided with closing means which are actuated by linearly movable parts of coupling devices provided with openings for discharge and entry of gas.

The invention will be explained more fully in the following with reference to the schematic drawing.

DESCRIPTION OF THE PREFERRED EMBODIMENTS

While the foregoing description and drawings represent the preferred embodiments of the present invention, it will be obvious to those skilled in the art that various changes and modifications may be made therein without departing from the true spirit and scope of the present invention.

Figure 1:
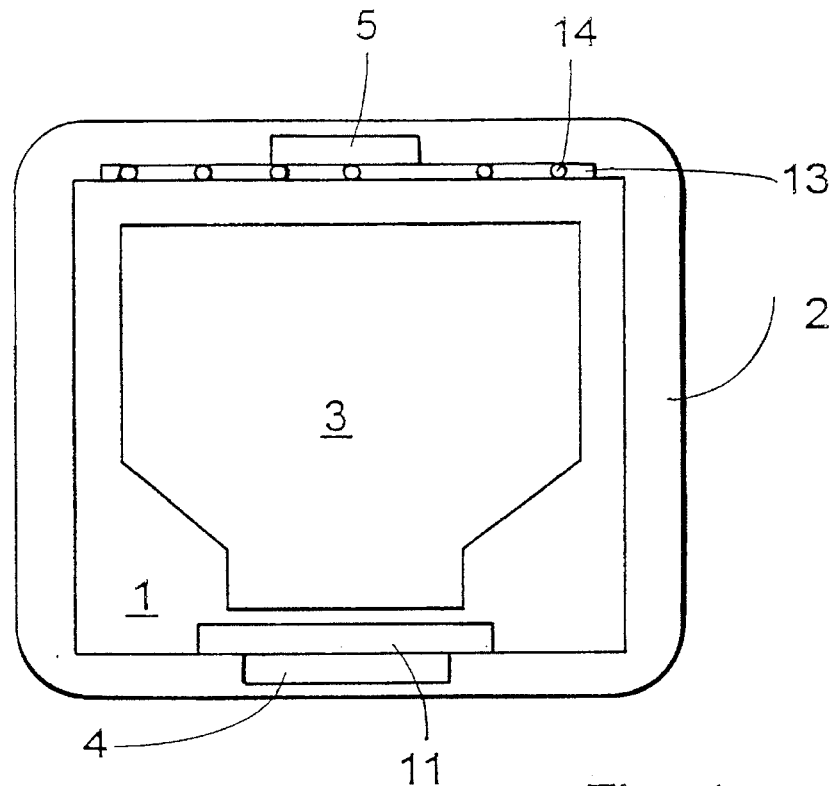
FIG. 1 shows a simplified top view of a magazine container in the form of a SMIF box.

As illustrated in FIG. 1, a magazine 3 for holding wafer-shaped objects, e.g., semiconductor wafers, is enclosed by the wall 2 of a magazine container constructed as a SMIF box 1. A gas feed duct 4 (FIGS. 1 and 2) and a gas discharge duct 5 (FIGS. 1 and 2) are incorporated within the wall 2, their ends at a depositing surface 6 being provided with automatically closing valves 7, 8 and enclosed by seals 9, 10 in the outlet region leading to the interior of the container.

Figure 2:
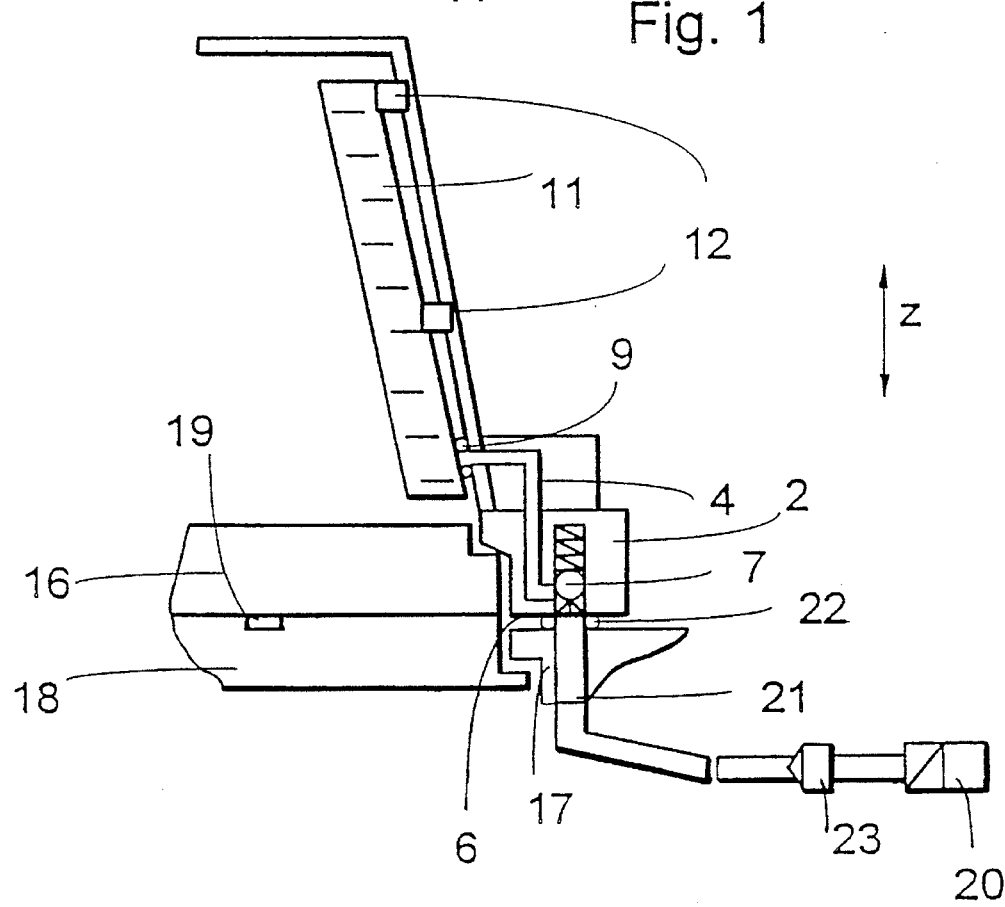
FIG. 2 shows first devices for gas feed in a deposited magazine container.

As further depicted in FIGS. 1 and 2 the seal 9 encloses a gas inlet opening (not shown) of a delivery strip 11 by which the gas feed duct 4 opens into gas distribution openings. For the purpose of cleaning the interior of the container and the delivery strip 11 itself, the latter is fastened to holders 12 such that it may easily be detached. The gas distribution openings are directed to spaces between wafer-shaped objects and adjacent to the bottom and top surfaces of the magazine 3, these wafer-shaped objects being stored in the magazine 3 vertically to a movement direction Z.

Figure 3:
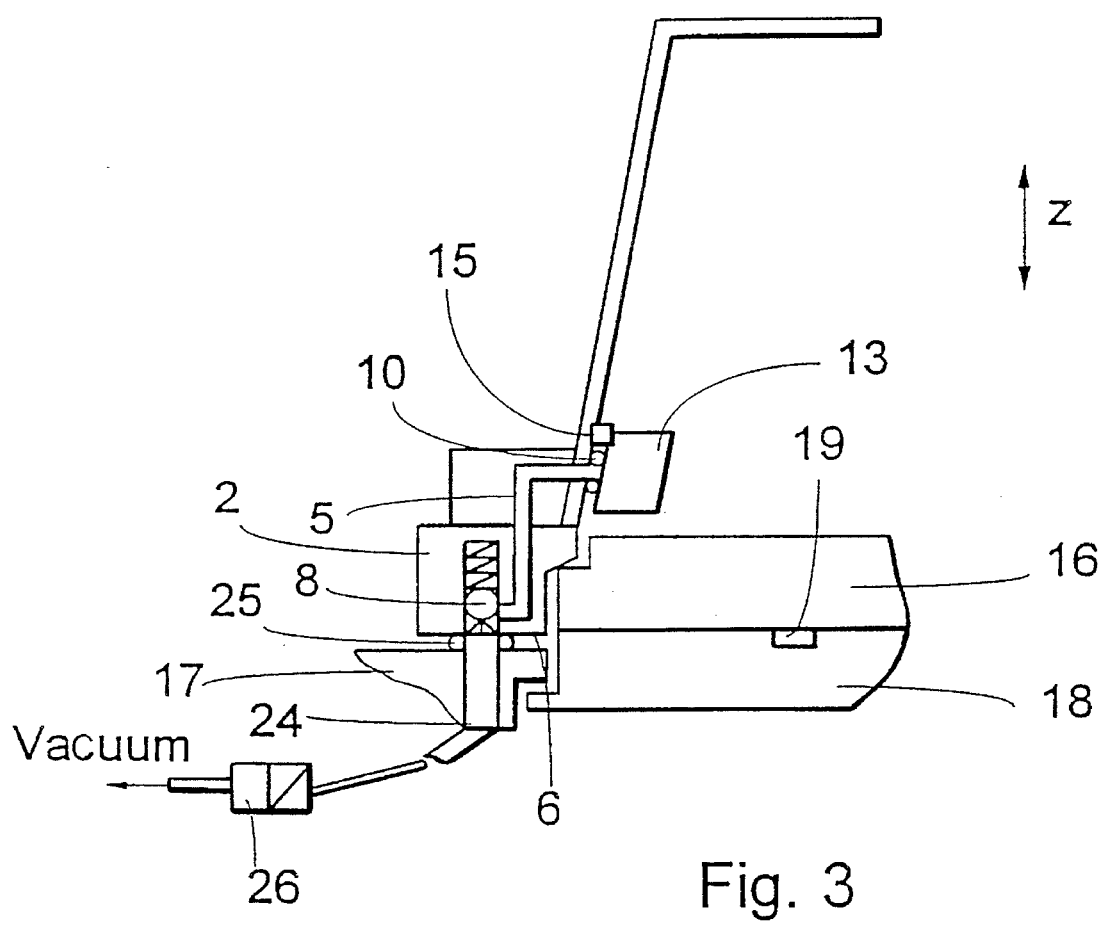
FIG. 3 shows first devices for gas discharge in a deposited magazine container.

As shown in FIGS. 1 and 3, the gas discharge duct 5 contacts a gas outlet opening (not shown) of a discharge strip 13 via a seal 10 and is thus coupled with gas discharge openings 14 which adjoin the gas distribution openings in the base region of the SMIF box opposite the magazine 3. The gas discharge openings 14 are structural components of the discharge strip 13 which, like the delivery strip 11, are easily detached, i.e., can easily be removed from the SMIF box 1 without loosening connecting elements. Corresponding holders are designated by (FIG. 3) 15. The SMIF box 1 is deposited by a releasable bottom 16 and by the depositing surface 6 on a holding plate 17 which has a lowerable plate part 18. Miniature feelers 19 provided between the bottom 16 and plate part 18 serve to control the gas exiting from a gas source 20 and to actuate the valves for a vacuum connection. A pipe piece 21 which faces the depositing surface 6, projects out of the holding plate 17 and actuates the valve 7 is connected to the gas source 20. A seal 22 provides for a tight connection. A filter 23 serves to clean the gas exiting from the gas source 20.

A pipe piece 24, shown in FIG. 3, which projects from the holding plate 17 like pipe piece 21 and is enclosed by a seal 25 is provided for actuating the valve 8. The pipe piece 24 is connected to a vacuum via an electromagnetic pneumatic valve 26.

In the deposited state of SMIF box 1, the bottom 16 rests on the plate part 18 and actuates the miniature feelers 19 whose signal opens an electromagnetic pneumatic valve in the gas source 20 (FIG. 2) and the pneumatic valve 26 (FIG. 3). Consequently, gas which has been cleaned by the filter 23 flows via the opened valve 7 and gas feed duct 4 into the delivery strip 11 which distributes the gas via the gas distribution openings such that the flow of gas is directed to the entire interior region of the SMIF box 1 and to the opposite side of the wall. In this way, an effective exchange of gas is carried out within the entire SMIF box 1.

The gas is discharged via the gas discharge openings 14, the gas discharge duct 5, the opened valve 8 and the pipe piece 24.

When the SMIF box 1 is removed from the holding plate 17, valves 7 and 8 are closed automatically. The pneumatic valves are closed either by the signal generated by the miniature feelers 19 or by a signal produced when the plate part 16 is lowered, which means that the flow of gas is interrupted when the SMIF box 1 is opened.

Figure 4:
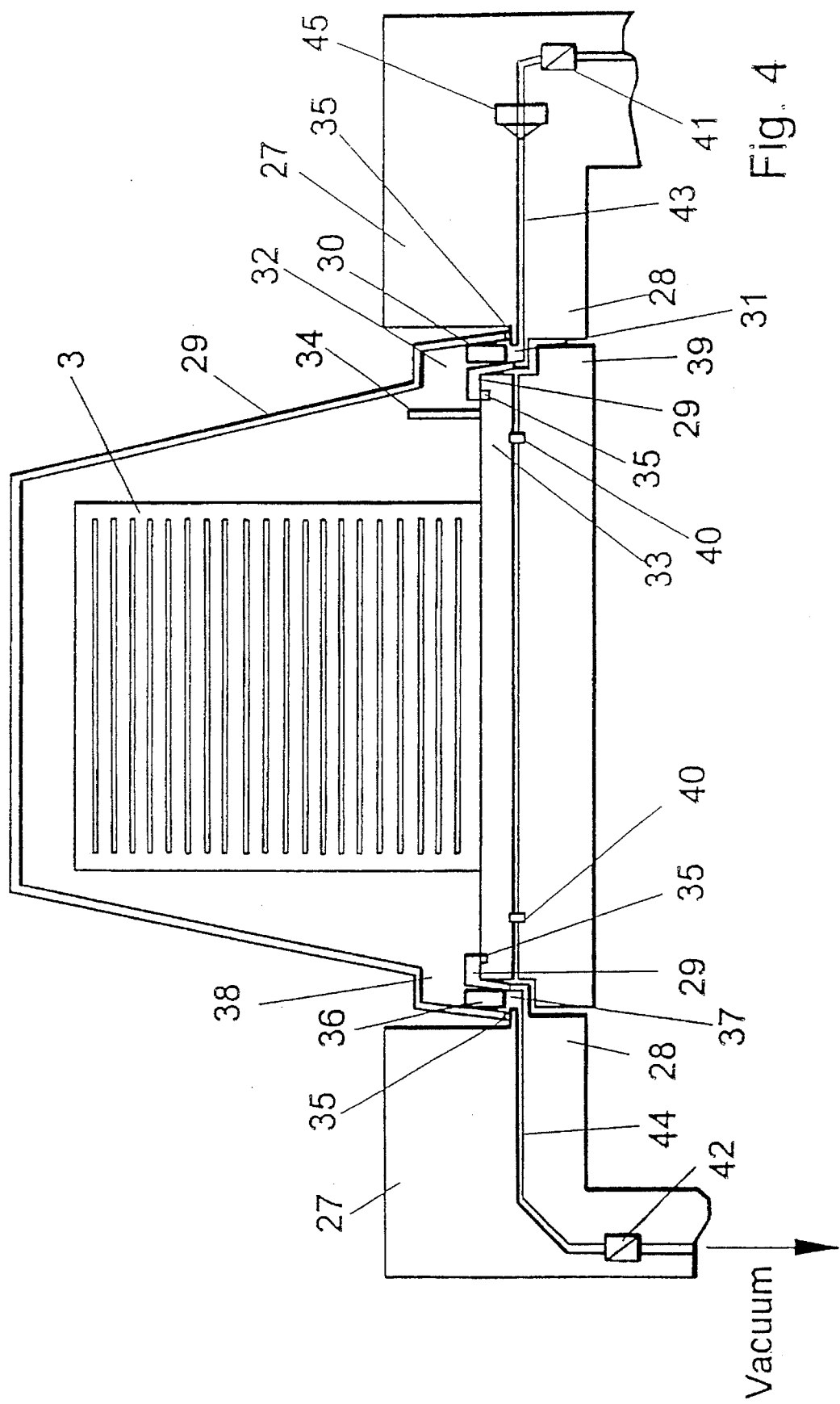
FIG. 4 shows a deposited magazine container with second devices for gas feed and gas discharge.
Figure 5:
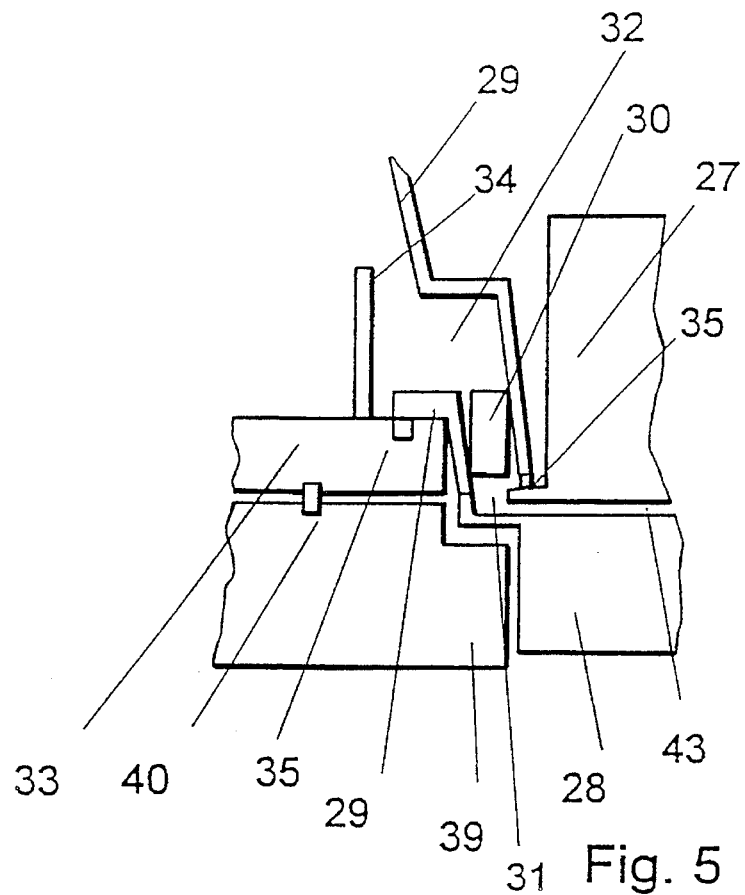
FIG. 5 shows the second devices for gas feed in an enlarged view.
Figure 6:
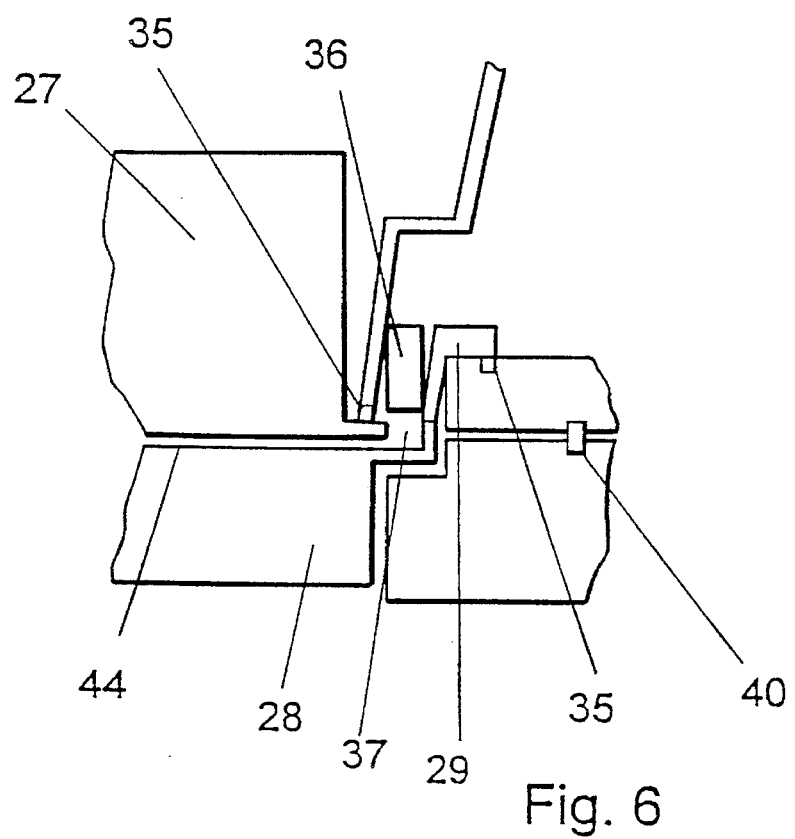
FIG. 6 shows the second devices for gas discharge in an enlarged view.

Another construction of the invention according to FIGS. 4 to 6 provides a SMIF box which is held laterally by guide rails 27 and is placed on a holding plate 28. A gas feed duct 31 (FIGS. 4 and 5) which can be closed by means of a flow-in valve 30 actuated by gas pressure is incorporated in the wall 29 of this SMIF box at one side adjacent to the magazine 3. The gas feed duct 31 opens into gas distribution means whose component parts include an enlarged flow-in space 32, whose boundaries are defined by angled portions of the wall 29, and a diffuser 34 which is arranged downstream of the flow-in space 32 and fastened to a releasable bottom 33. Seals 35 provide for a tight connection.

A gas discharge duct 37 (FIGS. 4 and 6) which can be closed by a flow-out valve 36 which is also actuated by gas pressure is incorporated in the wall 29 adjacent to the magazine 3 opposite the gas distribution means, this gas discharge duct 37 communicating with the interior of the SMIF box via an enlarged flow-out space 38 formed by angled portions of the wall 29.

As has already been described with respect to the construction according to FIGS. 1 and 2, pressure switches 40 (FIGS. 4 and 5) are actuated in the deposited state of the SMIF box, in which the bottom 33 rests on a lowerable plate part 39 of the holding plate 28, so that a signal generated by these pressure switches 40 opens electromagnetic pneumatic valves 41, 42 in gas lines 43, 44.

Gas from a gas source (not shown) flows through the gas line 43, is filtered by a filter 45 and arrives in the gas feed duct 31. The flow-in valve 30 is opened by the gas pressure and the gas flows into the flow-in space 32 in which it is deflected on the diffuser 34. The diffuser 34 generates a uniform flow through the interior regions of the SMIF box and magazine located therein, preferably to the spaces between semiconductor wafers in the magazine 3 and adjacent to the bottom and top surfaces. The gas passes through the gas discharge duct 37 into the gas line 44 via the flow-out space 38 and the flow-out valve 36 which is opened by vacuum pressure.

Figure 7:
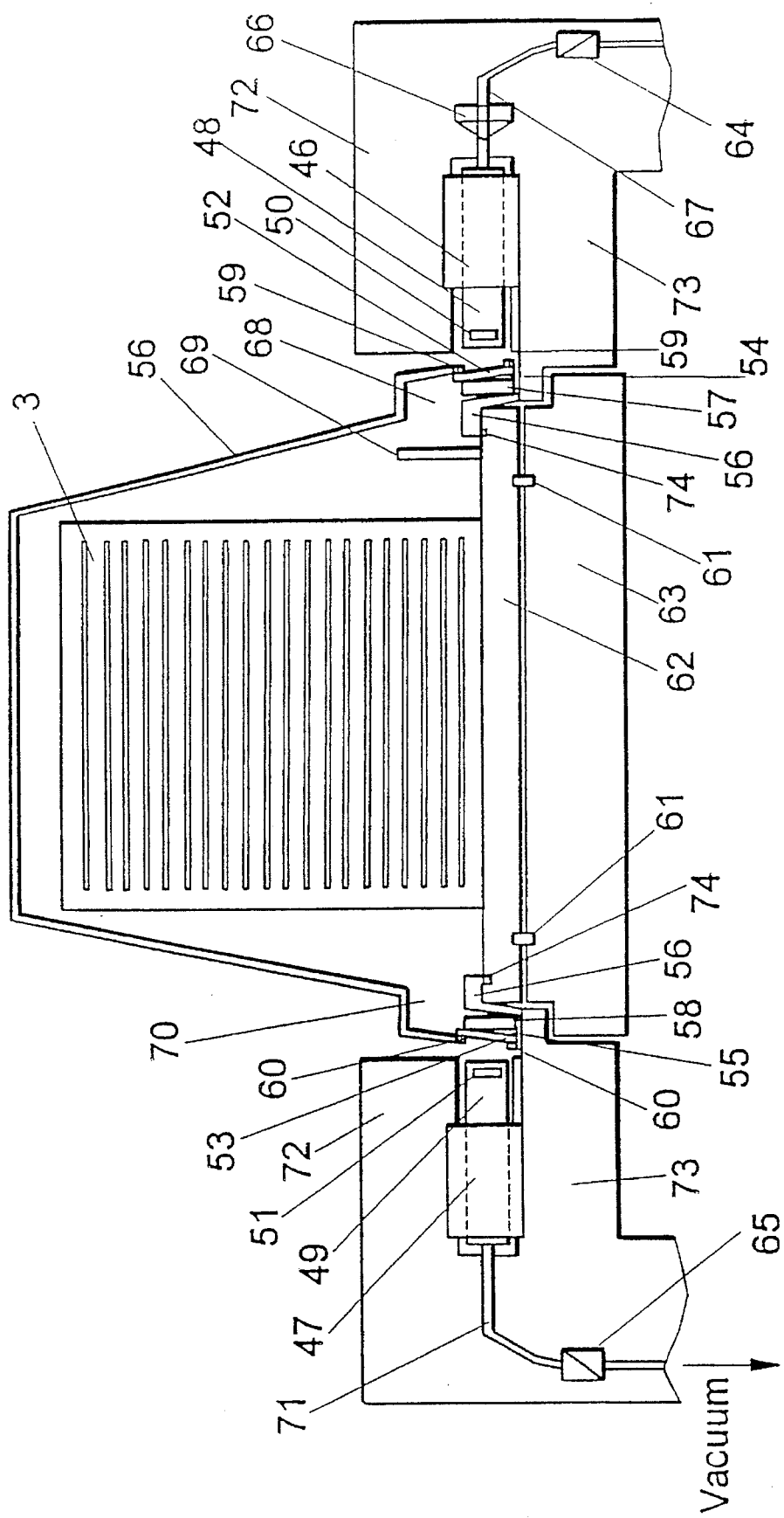
FIG. 7 shows a deposited magazine container with third devices for gas feed and gas discharge.
Figure 8:
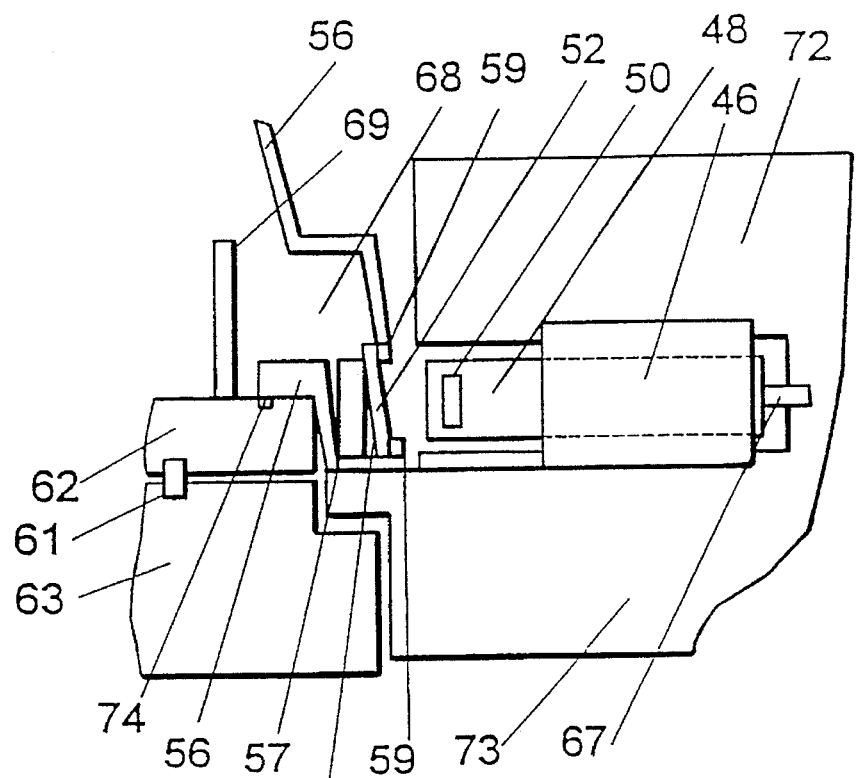
FIG. 8 shows the third devices for gas feed in an enlarged view.
Figure 9:
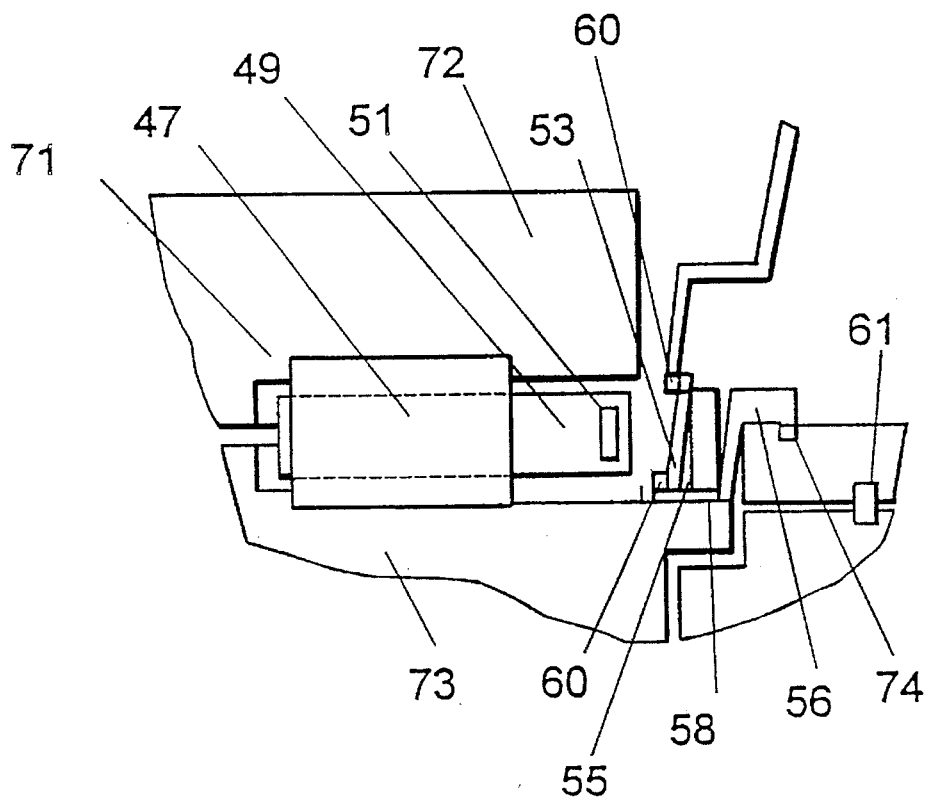
FIG. 9 shows the third devices for gas discharge in an enlarged view.

According to FIGS. 7 to 9, coupling devices 46, 47 are provided at the SMIF box for feeding and discharging gas, these coupling device 46, 47 containing linearly movable parts 48, 49 which are provided with openings 50, 51 for the inlet and outlet of gas and are suitable for opening closing means 52, 53 for a gas feed duct 54 and a gas discharge duct 55.

The gas feed duct 54 (FIGS. 7 and 8) and gas discharge duct 55 (FIGS. 7 and 9) are incorporated in the wall 56 adjacent to the magazine 3 on opposite sides. The closing means 52, 53 are pressed against sealing elements 59, 60 by spring elements 57, 58 so that the SMIF box is closed outwardly without actuation of the coupling devices 46, 47.

Signals from pressure switches 61 which are actuated when the SMIF box is deposited on a lowerable plate part 63 by its releasable bottom 62 set the linearly movable pans 48, 49 in motion and open electromagnetic pneumatic valves 64, 65. The gas flow cleaned by a filter 66 passes out of the opening 50 into the opened gas feed duct 54 via a gas line 67. A flow-in space 68, a diffuser 69 and a flow-out space 70 act according to the invention in the manner described with reference to FIGS. 4 to 6. Discharged gas exits the SMIF box via the opening 51 of the coupling device 47 and flows into gas line 71.

A guide rail is designated by 72, a holding plate is designated by 73 and a box seal is designated by 74.

Cancellation of the coupled state which is necessary for a returning movement of the movable parts 48, 49 is initiated by a feeler or switch (not shown) which can be actuated exclusively in the closed state of the SMIF box 1.

What is claimed is:

1. A device for transporting magazines for holding wafer-shaped objects, comprising:
    a magazine container having a releasable bottom wall and a side wall contiguous with said bottom wall, said side wall having a depositing surface engageable with a holding plate of an enclosure for a clean room, where the holding plate has a lowerable plate part, for supporting said bottom wall and a magazine in said container;
    a gas feed duct disposed in said side wall and proceeding from closable ducts in said side wall;
    means for distributing gas, said gas feed duct opening into said means for distributing; and
    a gas discharge duct communicating with a gas outlet adjacent to said means for distributing opposite the magazine.

2. The transport device according to claim 1, wherein the means for distribution of gas are formed by a delivery strip which is removably fastened to the wall and tightly connected with the gas feed duct and in which are incorporated gas distribution openings which are directed substantially to spaces between the wafer-shaped objects and adjacent to the bottom and top surfaces of the magazine, said gas outlet being formed by a discharge strip which is removably fastened to the wall, has gas discharge openings and is tightly connected with the gas discharge duct, and wherein the ducts terminate at the depositing surface in automatically closing valves which are opened when the magazine container is deposited by means of pipe pieces projecting out of the holding plate so as to face the depositing surface.

3. The transport device according to claim 2, wherein the pipe piece for opening the valve at the gas feed duct is connected to a gas source, the gas entering from gas source being regulated by a feeler which is actuated when the magazine is deposited.

4. The transport device according to claim 3, wherein the pipe piece for opening the valve at the gas discharge duct is connected to a vacuum, said connection being regulated by a feeler which is actuated when the magazine is deposited.

5. The transport device according to claim 1, wherein an enlarged flow-in space whose boundaries are formed by angled portions of the wall and a diffuser which is arranged downstream of the flow-in space in the direction of flow and is fastened to the releasable bottom are provided as means for gas distribution, and wherein the gas outlet is formed by a gas discharge duct which communicates with the interior of the magazine container via an enlarged flow-out space formed by angled portions of the wall.

6. The transport device according to claim 5, wherein the gas feed duct and the gas discharge duct can be closed by means of flow-in valves which are actuated by gas pressure.

7. The transport device according to claim 5, wherein the gas feed duct and gas discharge duct are provided with closing means which are actuated by linearly movable parts of coupling devices provided with openings for the discharge and entry of gas.

8. The transport device according to claim 1, further comprising valves provided in said gas feed duct and said gas discharge duct, said valves including actuation means for automatically opening said valves upon a placement of the device on the holding plate.

9. The transport device according to claim 8 wherein said actuation means includes means responsive to cooperating elements operatively coupled with the holding plate.

10. The transport device according to claim 1 wherein said means for distributing gas includes a delivery strip removably fastened to said wall.

11. A device for transporting magazines for holding wafer-shaped objects, comprising:
    a magazine container having a releasable bottom wall and a side wall contiguous with said bottom wall;
    a gas feed duct disposed in said side wall;
    means in said container for distributing gas from said gas feed duct into said container;
    a gas discharge duct disposed in said side wall on a side of said container opposite said gas feed duct; and
    valve means in said gas feed duct and said gas discharge duct for automatically opening said gas feed duct and said gas discharge duct to gas flow upon a deposition of said container on a holding plate of an enclosure for a clean room.

12. The transport device according to claim 11 wherein said means for distributing gas includes a delivery strip removably fastened to said side wall.

13. The transport device according to claim 12 wherein said delivery strip is provided with a plurality of gas distribution openings which are directed in part to spaces between wafer-shaped objects in a magazine disposed in said container.

* * * * *